(12) United States Patent
Elgebaly (10) Patent No.: US 7,944,266 B2
(45) Date of Patent: May 17, 2011

(54) LOW-VOLTAGE DOWN CONVERTER

(75) Inventor: Mohamed Elgebaly, San Jose, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 11/239,714

(22) Filed: Sep. 29, 2005

(65) Prior Publication Data

US 2007/0069796 A1   Mar. 29, 2007

(51) Int. Cl.
*H03L 5/00* (2006.01)
(52) U.S. Cl. .......................................... 327/333; 327/534
(58) Field of Classification Search .................. 327/333, 327/534; 326/63, 68, 80, 81
See application file for complete search history.

(56) References Cited

U.S. PATENT DOCUMENTS

| | | | |
|---|---|---|---|
| 3,710,271 | A | 1/1973 | Putnam |
| 4,704,549 | A | 11/1987 | Sanwo et al. |
| 5,200,921 | A * | 4/1993 | Okajima ................. 365/189.11 |
| 5,483,205 | A * | 1/1996 | Kawamura .................. 331/74 |
| 5,896,044 | A * | 4/1999 | Walden ........................ 326/80 |
| 6,240,027 | B1 * | 5/2001 | Lee et al. ................ 365/189.11 |
| 6,243,468 | B1 | 6/2001 | Pearce et al. ................ 380/255 |
| 6,246,259 | B1 * | 6/2001 | Zaliznyak et al. ............. 326/41 |
| 6,259,299 | B1 | 7/2001 | Ryu |
| 6,271,713 | B1 * | 8/2001 | Krishnamurthy ............. 327/534 |
| 6,433,582 | B2 * | 8/2002 | Hirano .......................... 326/68 |
| 6,498,526 | B2 * | 12/2002 | Lim et al. ..................... 327/525 |
| 6,566,931 | B2 * | 5/2003 | Higuchi ....................... 327/333 |
| 6,903,576 | B2 * | 6/2005 | Narwal ......................... 326/68 |
| 2003/0090308 | A1 * | 5/2003 | Huynh et al. ................. 327/227 |

FOREIGN PATENT DOCUMENTS

| | | | |
|---|---|---|---|
| JP | 59 012628 A | | 1/1984 |
| JP | 092332938 A | * | 9/1997 |
| JP | 11 214981 A | | 8/1999 |

OTHER PUBLICATIONS

Gralla, Preston. "How the Internet Works", QUE, USA Today. (2001). 6$^{th}$ Edition. pp. 303-307.
International Search Report—PCT/US06/038109, International Search Authority—European Patent Office—Jan. 17, 2007.
Written Opinion-PCT/US06/038109, International Search Authority-European Patent Office-Jan. 17, 2007.
Taiwanese Search report - 095136315 - TIPO - Oct. 18, 2010.

* cited by examiner

*Primary Examiner* — Quan Tra
(74) *Attorney, Agent, or Firm* — Jiayu Xu (57) ABSTRACT

A low-voltage level converter provides level conversion for multiple-supply voltages for very large scale integration (VLSI) systems. Low voltage-level down conversion is achieved at very low voltage operation for on-chip test circuitry for multiple-supply voltage systems. The converter includes an output driver PMOS FET (positive metal-oxide semiconductor field effect transistor) with its well grounded. An output NMOS FET (negative MOS FET) and an extra input pulldown NMOS FET are connected in parallel to the input of the converter. The extra input pulldown NMOS FET provides a negative gate voltage at its drain to the output driver PMOS FET gate. The negative gate voltage and grounded well significantly decrease rise time of the output signal noise pulse of the converter and virtually eliminate a negative spike voltage at the initial transition of the output pulse produced by coupling effect between the input pulse and output pulse due to Miller capacitance effect.

27 Claims, 7 Drawing Sheets

LOW-VOLTAGE DOWN CONVERTER

BACKGROUND OF THE INVENTION

The present invention generally relates to level conversion for multiple-supply voltages for very large scale integration systems and, more particularly, to low voltage-level down conversion with very low voltage operation for on-chip test circuitry.

Prior art voltage level conversion, e.g., for a dual-supply voltage system, is commonly performed through a differential inverter circuit. The output response for such a circuit is generally limited by the driving capability of the output inverter, e.g., a MOSFET (metal-oxide semiconductor field effect transistor) used to drive the load. Achieving low voltage operation by increasing the output driver size to get more current drive typically does not solve the problem due to the fact that upsizing the driver increases the intrinsic and coupling capacitance MOSFET devices typically have considerable coupling capacitance between their gate and drain terminals. The high edge rate of rise (fall) of drain voltage may couple capacitively to the gate of the MOSFET via the Miller capacitance. The coupling can cause the gate voltage of the MOSFET to rise resulting in unintended or deleterious operation of the circuit. Thus, upsizing the driver to get more current drive may in fact lead to a degradation rather than an improvement in level conversion circuit performance.

Figure 1:
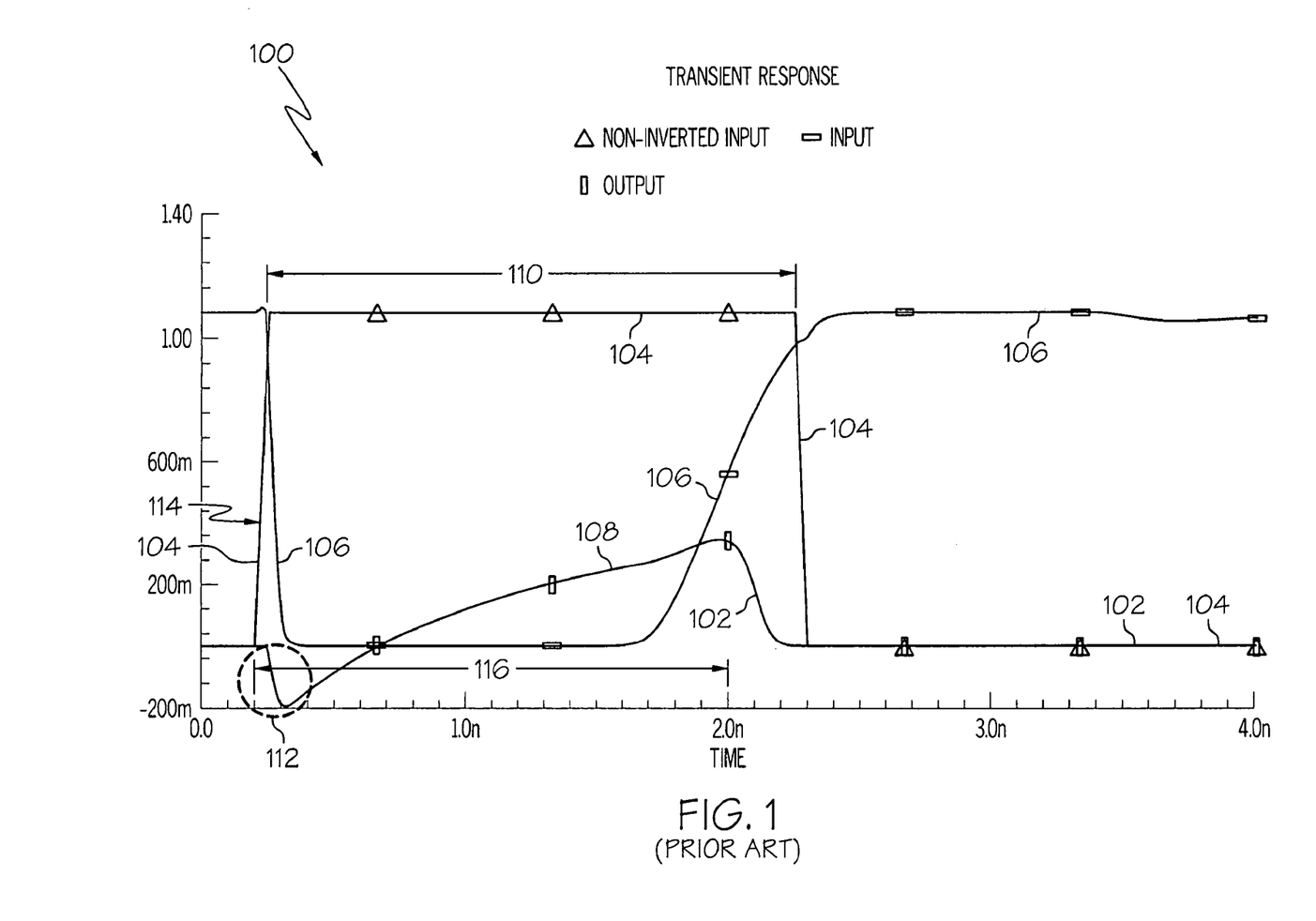
FIG. 1 is a voltage-time graph of transient response for a prior art level converter circuit.

For an on-chip test circuit, one objective is to convert an input signal, e.g., a test noise pulse, from a high supply voltage level to a lower supply voltage level. Due to the trade-off between current drive and intrinsic capacitance, however, prior art circuits have not been able to achieve a satisfactorily short rise time of the output signal at the lower supply voltage while producing the current drive required. To illustrate, FIG. 1 shows transient response for one example of a prior art level converter on graph 100 of voltage, shown in millivolts (m) on the ordinate, against time, shown in nanoseconds (n) on the abscissa. Graph 100 shows output pulse 102 for comparison on the same graph with input pulse 106. Input pulse 106 is a result of non-inverted input pulse 104. As can be seen in FIG. 1, output pulse 102 has a poor rise time, indicated generally at 108, so that the output pulse rise time 116 (succinctly, the time for voltage of output pulse 102 to go from 10 % to 90% of the full amplitude voltage level) occupies an unacceptably large portion of the pulse width 110 of input pulse 102. For example, as shown in FIG. 1, the rise time 116 is approximately 1.7 nanoseconds out of the entire pulse width 110 of approximately 2.2 nanoseconds. In addition, the Miller capacitance effect may produce an initial voltage drop 112, which may also be referred to as coupling effect. Such a voltage drop 112 is the opposite of desired circuit performance for the rising edge 114 (LOW to HIGH transition) of the input pulse 104 and adversely affects the long rise time 116.

As can be seen, there is a need for a low voltage level converter that converts an input signal from a high supply voltage level to a lower supply voltage level. There is also a need for a level down converter that overcomes the limitations of Miller capacitance to provide required current drive with significant improved, i.e., shortened, rise time of the output pulse.

SUMMARY OF THE INVENTION

In one embodiment of the present invention, a low-voltage level converter circuit includes an output driver transistor and a separate input pulldown transistor that provides a pulldown voltage to the gate of the output driver transistor.

In another embodiment of the present invention, a system includes a low-voltage level converter having an input pulldown negative metal-oxide semiconductor (NMOS) transistor that provides a negative gate voltage to a positive metal-oxide semiconductor (PMOS) output driver transistor having a grounded well.

In still another embodiment of the present invention, an on-chip test system includes a pulse generator that provides an input pulse signal at a high supply voltage level to a low-voltage level converter. The low-voltage level converter includes an input pulldown transistor that provides a negative gate voltage to an output driver PMOS FET having a grounded well; and an output NMOS FET having a gate connected in parallel with the input pulldown transistor to an input of the low-voltage level converter. The input of the low-voltage level converter receives the input pulse signal from the pulse generator. The drains of both the PMOS FET and the output NMOS FET are both connected to an output of the low-voltage level converter; and a device under test is connected to the output of the low-voltage level converter. The device under test receives an output signal noise pulse at a low supply voltage level.

In yet another embodiment of the present invention, a VLSI integrated circuit chip includes a low-voltage level converter. The low-voltage level converter includes an output driver PMOS FET with its drain connected to an output of the low-voltage level converter and its well grounded. The low-voltage level converter also includes an output NMOS FET with its drain connected to the output of the low-voltage level converter and its gate connected to the input of the low-voltage level converter; and an input pulldown NMOS FET that provides a negative gate voltage at its drain to the output driver PMOS FET and has its gate connected in parallel with the output NMOS FET to the input of the low-voltage level converter. The input of the low-voltage level converter receives an input pulse signal at a high supply voltage level; and provides an output signal noise pulse at a low supply voltage level.

In a further embodiment of the present invention, a method of voltage level conversion includes the steps of: (1) connecting a drain of an output driver transistor to an output of a low-voltage level converter; (2) connecting a drain of an output transistor to the output of the low-voltage level converter; (3) connecting a drain of an input pulldown transistor to a gate of the output driver transistor to provide a negative gate voltage to the output driver transistor; and (4) applying an input pulse to a gate of the input pulldown transistor and a gate of the output transistor so that an output signal noise pulse is provided at the output of the low-voltage level converter at a lower voltage than that of the input pulse.

In a still further embodiment of the present invention, a means for low-voltage level down converting a voltage pulse includes a means for driving a load; and a means for providing a pulldown gate voltage to the means for driving a load. The pulldown gate voltage increases the current drive of the means for driving a load and decreases switching time of the means for driving a load.

These and other features, aspects and advantages of the present invention will become better understood with reference to the following drawings, description and claims.

DETAILED DESCRIPTION OF THE INVENTION

The following detailed description is of the best currently contemplated modes of carrying out the invention. The description is not to be taken in a limiting sense, but is made merely for the purpose of illustrating the general principles of the invention, since the scope of the invention is best defined by the appended claims.

Broadly, the present invention provides low-voltage level down conversion with very low voltage operation, which may be especially suited for operation in very large scale integrated (VLSI) circuit chips. One embodiment may provide on-chip test circuitry that can operate at very low voltages, e.g., 300-450 millivolts (mV) with a relatively high transistor threshold voltage (400-500 mV). In one embodiment, the low voltage level converter converts an input signal level from a high supply voltage level to a lower supply voltage level where the lower supply voltage level can be very close to the threshold voltage of the output driver without significant degradation in performance, e.g., increases in rise time of the output pulse or inability to drive the load.

One embodiment differs, for example, from prior art by using a separate (i.e., not present in the prior art) NMOS (negative metal-oxide semiconductor) input transistor to pull the gate of the output PMOS (positive metal-oxide semiconductor) transistor down (e.g., negative) using the input signal to the transistor. Negative gate voltage may provide more current drive. For example, using normal gate voltage of zero volts, current drive for the output PMOS may be 400 to 500 micro-amps maximum. Using a negative gate voltage may provide more current drive. As a result, negative gate voltage may allow the transistor to switch (e.g., from off to on) much faster. Therefore, the higher switching speed and the additional current drive may improve—decrease—the rise time of the circuit's output pulse.

Also novel in addition to the use of the extra input pulldown NMOS transistor is the combination of using the extra input pulldown NMOS transistor that lowers the gate voltage of the output PMOS transistor along with lowering the threshold voltage (e.g., the voltage required to switch the transistor on) of the output PMOS transistor. For example, threshold voltage of the output PMOS transistor may be lowered by connecting the well of the output PMOS transistor to ground. Lowering the threshold voltage of the output PMOS transistor can help the current drive and provide a faster transition (decreased rise time). In one embodiment, the gate of the output PMOS may be pulled down to a negative voltage through the Miller effect between the extra pulldown NMOS transistor and the output PMOS, the circuit being connected so that the Miller effect of both the output PMOS transistor and the extra pulldown NMOS transistor may be in the same direction so that the only coupling effect that affects the output transition may be that of the output NMOS transistor—resulting in a small coupling effect and short rise time. Thus, one embodiment turns Miller effect to advantage in contrast to prior art circuits where Miller effect works only to disadvantage. In summary, an embodiment of the inventive circuit may do two things compared to a conventional inverter circuit: (1) Miller effect coupling of the output to input may be almost eliminated so there may be no negative dip in the output pulse; and (2) the output pulse may have a shorter rise time because the output PMOS transistor may have a much faster switching speed.

Figure 3:
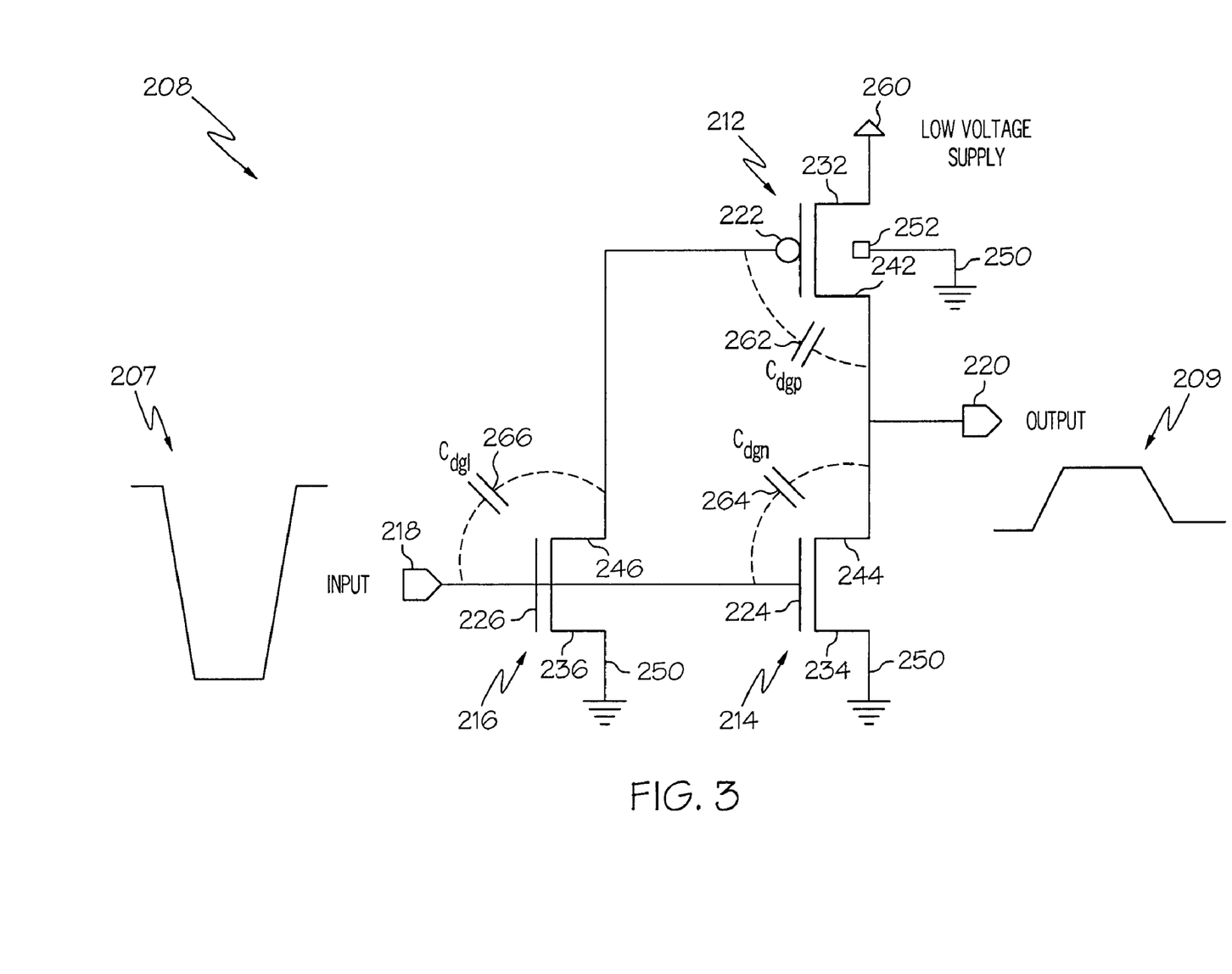
FIG. 3 is a circuit diagram for a low-voltage level converter circuit in accordance with one embodiment of the present invention.

In addition, the converter circuit illustrated, for example, in FIG. 3 may be unusual and counterintuitive because when input is HIGH there may be a direct current (DC) path between the output PMOS transistor and the output NMOS transistor from supply to ground. It is not usual in CMOS (complementary metal-oxide semiconductor) design to have a direct path between supply and ground. For the applications involving a special circuit used only for testing, however, the test circuits have a short period of operation and are turned off during normal operation of the chip so that the level converter shown in FIG. 3 may be used for such an application even though the configuration is unconventional.

Figure 2:
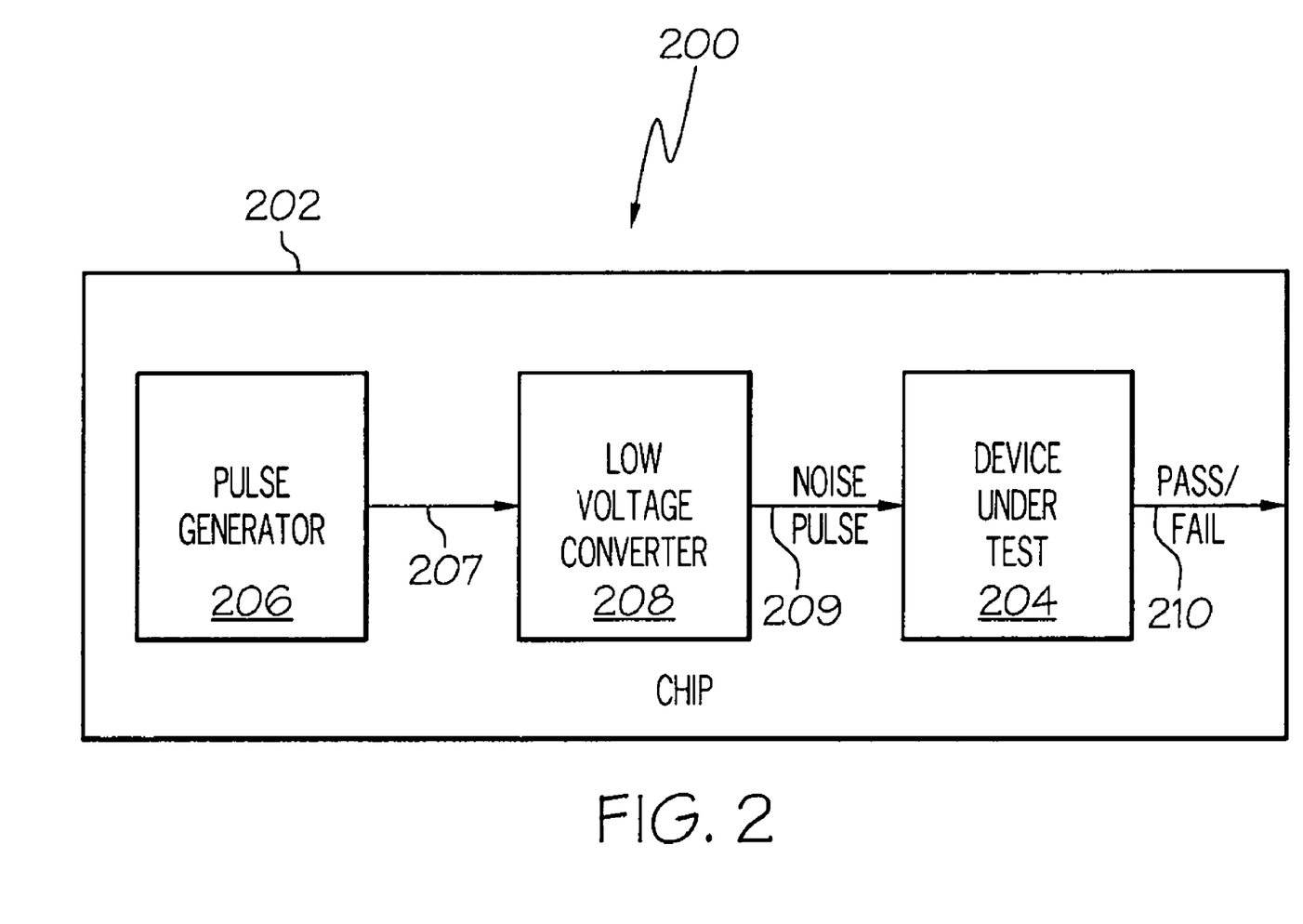
FIG. 2 is a system block diagram of an on-chip test system in accordance with one embodiment of the present invention.

FIG. 2 illustrates an exemplary on-chip test system 200 for a VLSI integrated circuit chip 202 in accordance with an embodiment of the present invention. The on-chip test system 200 may be used, for example, to generate a noise pulse to test the noise margin of CMOS circuits on chip 202. Circuit chip 202 may be a VLSI circuit used for a modem (modulator-demodulator) chip, for example, used to digitally encode and decode wireless signals for a mobile phone. The device under test 204 may be, for example, the entire system embodied by the chip 202—such as the modem in the case of a modem chip—or may be a subsystem of the chip 202—such as a modulator in the case of a modem chip. On-chip test system 200 may include a pulse generator 206, which may generate a square wave pulse input signal 207 applied at the input of low-voltage level converter 208. Taking the square wave pulse input signal 207 as input, low-voltage level converter 208 may produce a noise pulse 209 as output signal. Low-voltage level converter 208 may convert an input pulse, e.g., square wave pulse input signal 207, having a nominal level of 1.2 Volts (V), to an output pulse—such as noise pulse 209—having a nominal level in the range of 300-400 mV and having a short enough rise time to reproduce a substantially square wave output from a square wave input. For example, an output wave form such as that of output pulse 102, shown in FIG. 1, having a long rise time 108 and pronounced coupling effect 112 to the input pulse is not useful as a noise pulse 209 output of low-voltage level converter 208 for testing noise margin of CMOS circuits on chip 202 as practiced using on-chip test system 200. The noise pulse 209 output of converter 208 may be injected at various points in the circuit of device under test 204 depending on the specific nature and specifications of device 204. Device 204 may be connected from various points in the circuit of device 204 to monitor and measure various parameters—such as circuit voltages and currents—and depending on the specific nature and specifications of device 204 the measurements may be used to provide a result of the test, indicated, for example, as pass/fail result 210 in FIG. 2.

FIG. 3 shows a low-voltage level converter 208 according to one embodiment. Low-voltage level converter 208 may be implemented using CMOS fabrication techniques on a VLSI chip—such as VLSI integrated circuit chip 202. Converter 208 may include a "top" output driver transistor 212, which may be a PMOS field effect transistor (FET) as shown in FIG.

3. Converter 208 may also include a "bottom" output transistor 214, which may be an NMOS FET as shown. Converter 208 may further include an input pulldown transistor 216, which may be an NMOS FET as shown. Top output driver transistor 212, bottom output transistor 214, and input pulldown transistor 216 may be connected as shown in FIG. 3.

Input signal 207 may be fed to converter input 218. Converter input 218 may be connected (in parallel) both to the gate 226 of input pulldown NMOS transistor 216 and the gate 224 of bottom output NMOS transistor 214. Both the source 236 of input pulldown NMOS transistor 216 and the source 234 of bottom output NMOS transistor 214 may be connected to ground 250 as shown in FIG. 3. Source 232 of top output driver PMOS transistor 212 may be connected to a low-voltage power supply providing supply voltage $V_{dd\_noise}$ 260. For example, a high-voltage power supply for chip 202 may nominally provide between about 1.0 to 1.5 V, while the low-voltage power supply for chip 202 may nominally provide between about 300 mV to 500 mV. The drain 242 of top output driver PMOS transistor 212 may be connected to output 220 and the drain 244 of bottom output NMOS transistor 214 also may be connected to output 220. Output 220 may provide output noise pulse signal 209 to a load—such as device under test 204.

The drain 246 of input pulldown NMOS transistor 216 may be connected to the gate 222 top output driver PMOS transistor 212. In operation of test system 200, when input pulse 207 goes LOW, the connection of drain 246 to gate 222 may provide a negative voltage at gate 222, which may, for example, increase the current drive and switching speed of top output driver PMOS transistor 212. The well 252 of top output driver PMOS transistor 212 may be connected to ground 250. In operation of test system 200, the connection of well 252 to ground 250, for example—in contrast to a more conventional connection of well 252 to the supply voltage $V_{dd\_noise}$ 260—may lower the threshold voltage of top output driver PMOS transistor 212 and also increase the current drive and switching speed of top output driver PMOS transistor 212.

Top output driver PMOS transistor 212 may have an intrinsic gate-to-drain capacitance Cgdp, which, on account of the well-known Miller effect, may be referred to as Miller capacitance 262. Likewise, bottom output NMOS transistor 214 may have an intrinsic gate-to-drain capacitance Cgdn, Miller capacitance 264; and input pulldown NMOS transistor 216 may have an intrinsic gate-to-drain capacitance Cgdi, Miller capacitance 266. In operation of test system 200, the connection of drain 246 to gate 222 may couple the effect of Miller capacitance 266 to the gate 222 of output driver PMOS transistor 212 so that, for example, when input pulse 207 goes LOW, the gate 222 of the output driver PMOS transistor 212 may be pulled down to a negative voltage through the Miller effect (Cgdi 266) between the extra input pulldown NMOS transistor 216 and the output driver PMOS transistor 212. Miller effect of both the output PMOS (Cgdp 262) and the extra input pulldown NMOS (Cgdi 266) transistors may be in the same direction so that the only Miller effect that affects the output 220 transition may be that of the output NMOS transistor (Cgdn 264). Thus, coupling effect (see FIGS. 4 through 6) becomes negligible (e.g., less than about 30 mV compared to prior art coupling effects ranging from about 100 to 200 mV). The transistor 214 may be made small enough so that the coupling capacitance 264 effect on the output is minimal.

Figure 4:
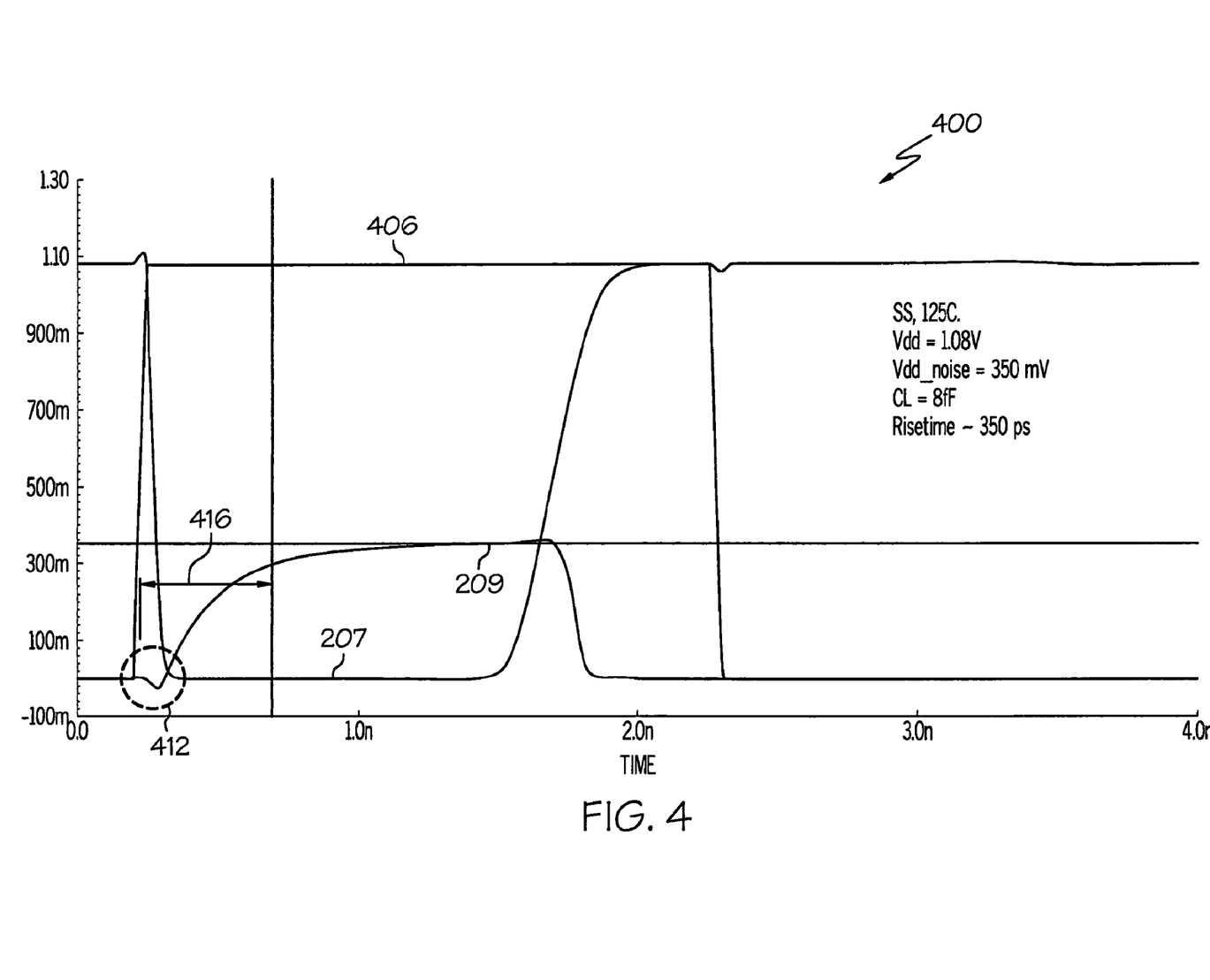
FIG. 4 is a graph showing simulation results for the converter circuit of FIG. 3.

FIG. 4 shows transient response simulation results using a SPICE (Simulation Program with Integrated Circuit Emphasis) model for the converter circuit 208 of FIG. 3. Simulation may be performed, for example, using parameters $V_{dd}$ (high-voltage power supply for chip 202)=1.08V; $V_{dd\_noise}$ (supply voltage 260)=350 mV, and a load connected at output 220, specified in terms of load capacitance as $C_L$=8 femtoFarads (fF). Graph 400 shows voltage in millivolts (m) on the ordinate, against time, shown in nanoseconds (n) on the abscissa. Graph 400 shows output pulse 209 for comparison on the same graph with input pulse 207. Also shown for comparison is non-inverted input pulse 406; input pulse 207 may be a result of non-inverted input pulse 406. Output pulse rise time 416 may be seen to be approximately 350 pico seconds (ps) or about 0.35 nanoseconds. Coupling effect 412 may be seen to be less than approximately 30 millivolts.

Figure 5:
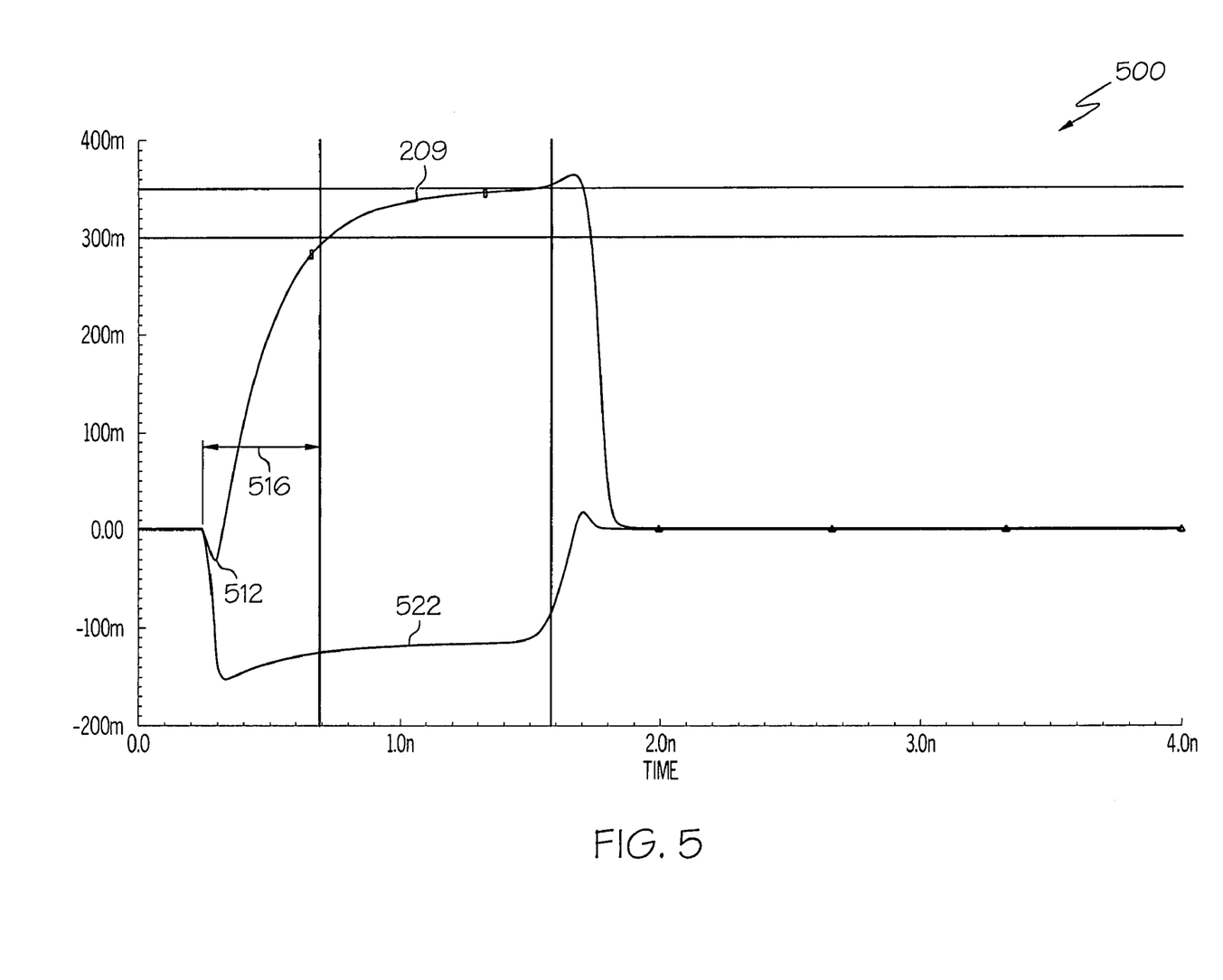
FIG. 5 is a graph showing gate and output voltages for the converter circuit of FIG. 3.

FIG. 5 shows gate and output voltages for a low-voltage level converter 208 such as that illustrated in FIG. 3. Graph 500 shows voltage in millivolts (m) on the ordinate, against time, shown in nanoseconds (n) on the abscissa. Graph 500 shows output pulse 209 for comparison on the same graph with the corresponding voltage at gate 222 of top output driver PMOS transistor 212, referred to as gate voltage 522. FIG. 5 shows that the negative gate voltage 522 resulting from Miller effect between the extra pulldown NMOS transistor 216 and the output PMOS driver transistor 212 results in approximately 150 mV. This result may be in a boosted PMOS current drive, for example, achieved by providing the negative gate voltage 522 or by connecting the well of the output driver PMOS transistor 212 to ground 250, or combination of both. As a result, a significant reduction in rise time 516 (to approximately 350 ps as shown in FIG. 5) of the noise pulse 209 may be achieved. Also, coupling effect 512 may be seen in FIG. 5 to be less than approximately 30 millivolts.

Figure 6:
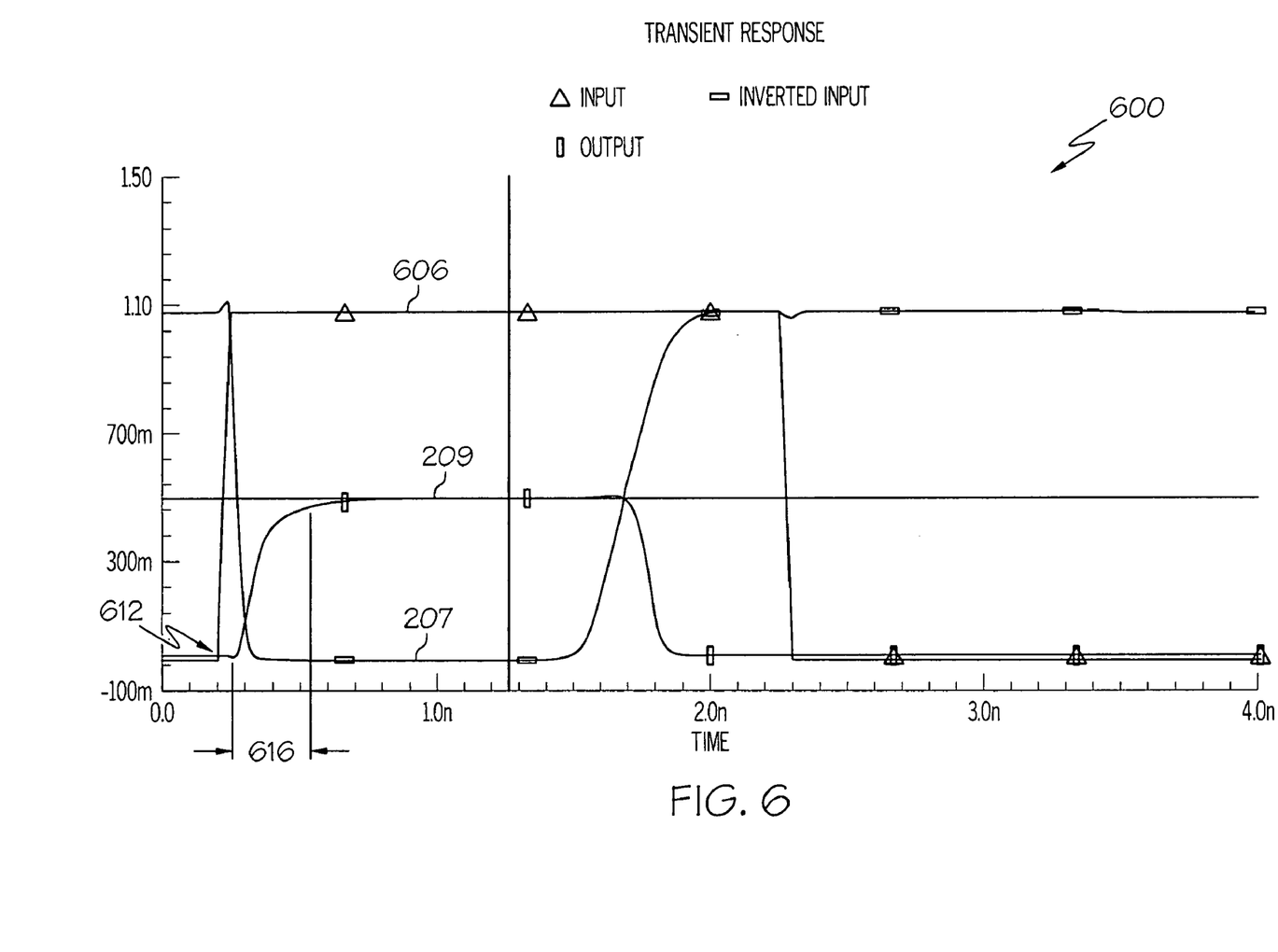
FIG. 6 is a graph showing simulation results under alternative conditions for the converter circuit of FIG. 3.

FIG. 6 shows transient response simulation results using a SPICE model for the converter circuit 208 of FIG. 3 using alternative parameters than those used in FIG. 4. Simulation may be performed, for example, using parameters $V_{dd}$ (high-voltage power supply for chip 202)=1.08V; $V_{dd\_noise}$ (supply voltage 260)=500 mV, and a load connected at output 220, having load capacitance $C_L$=8 fF. Graph 600 shows voltage in millivolts (m) on the ordinate, against time, shown in nanoseconds (n) on the abscissa. Graph 600 shows output pulse 209 for comparison on the same graph with input pulse 207. Also shown for comparison is non-inverted input pulse 606; input pulse 207 may be a result of non-inverted input pulse 606. Output pulse rise time 616 may be seen to be approximately 150 picoseconds (ps). Coupling effect 612 may be seen to be negligible relative to the scale of graph 600, e.g., less than 10 milliVolts.

Figure 7:
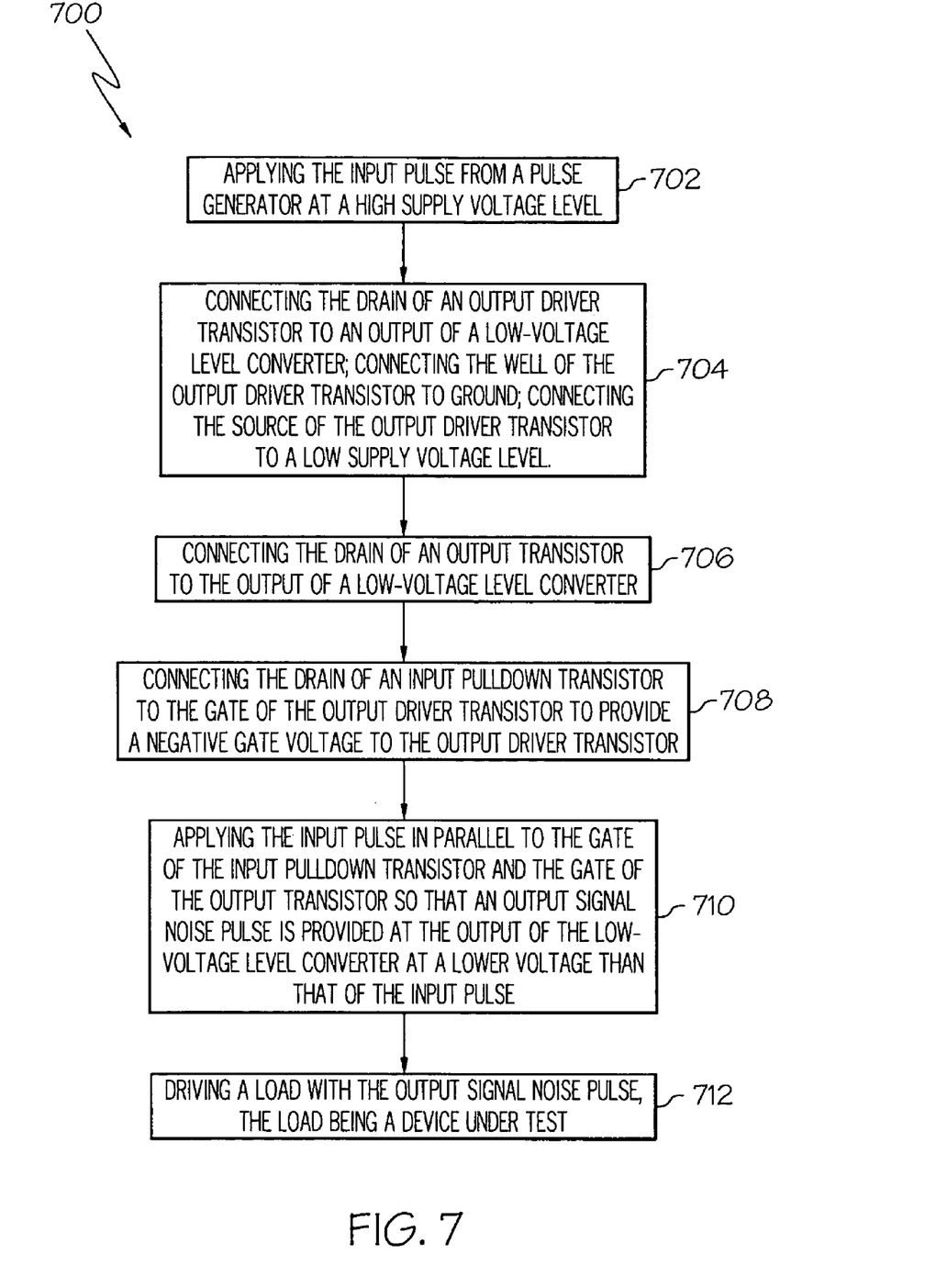
FIG. 7 is a flowchart of a method for low-voltage level conversion in accordance with one embodiment of the present invention.

FIG. 7 is a flowchart illustrating a method 700 for low-voltage level conversion in accordance with one embodiment of the present invention. Method 700 may include a step 702 of applying an input pulse—such as square wave pulse input signal 207—from a pulse generator (e.g., pulse generator 206) at a high supply voltage level, for example, one that may be nominally between 1.0 to 1.5 V from a multiple-supply voltage system that may also supply a low supply voltage level nominally between 300 to 500 mV. Method 700 may also include connecting an output driver transistor—such as output driver PMOS FET transistor 212—at step 704. Step 704 may include, for example, connecting the drain 242 of output driver transistor 212 to output 220 of low-voltage level converter circuit 208. Step 704 may also include, for example, connecting the well 252 of the output driver transistor 212 to ground 250. In addition, step 704 may include, for example, connecting the source 232 of the output driver transistor 212 to a low supply voltage level—such as supply voltage $V_{dd\_noise}$ 260.

Method 700 may also include a step 706 of connecting the drain of an output transistor—such as drain 244 of bottom output NMOS FET transistor 214—to the output 220 of the low-voltage level converter 208. Step 708 may include connecting the drain of an extra input pulldown transistor—such as drain 246 of input pulldown NMOS FET transistor 216—to the gate of the output driver transistor (e.g., gate 222 of output driver PMOS FET transistor 212) to provide a negative gate voltage 522 to the output driver PMOS transistor 212. Method 700 may further include step 710 of applying the input pulse 207 in parallel both to the gate 226 of the input pulldown NMOS transistor 216 and the gate 224 of the output NMOS transistor 214 so that an output signal noise pulse—such as output signal noise pulse 209 having a short rise time and negligible coupling effect as shown, for example, in FIGS. 4 through 6—may be provided at the output 220 of the low-voltage level converter 208 at a lower voltage (e.g. low supply voltage level such as supply voltage 260) than that of the input pulse (e.g. high supply voltage level $V_{dd}$, such as nominal 1.2 V). A step 712 of driving a load with the output signal noise pulse 209, for example, the load being a device under test 204, may also be included in method 700.

It should be understood, of course, that the foregoing relates to exemplary embodiments of the invention and that modifications may be made without departing from the spirit and scope of the invention as set forth in the following claims.

I claim:

1. A low-voltage level converter circuit having an input and an output, the circuit comprising:
    a first output driver transistor having a source connected to a lower supply voltage of a dual-level voltage supply, a drain connected to the output of the circuit, and a well connected to ground;
    a second output driver transistor having a gate connected to the input of the circuit, a source connected to the ground, and a drain connected to the output of the circuit; and
    a separate input pulldown transistor having a gate connected to the input of the circuit and a drain connected to a gate of the first output driver transistor for providing a pulldown voltage to the gate of the first output driver transistor.

2. The low-voltage level converter of claim 1, wherein:
    the input pulldown transistor of the converter receives an input pulse having a higher voltage than the voltage of the lower supply voltage.

3. The low-voltage level converter of claim 1, wherein:
    the first output driver transistor is a positive metal-oxide semiconductor (PMOS) field effect transistor.

4. The low-voltage level converter of claim 1, wherein:
    the second output driver transistor and the input pulldown transistor are negative metal-oxide semiconductor (NMOS) field effect transistors.

5. The low-voltage level converter of claim 1, wherein:
    an output voltage at the output of the converter is no greater than approximately 500 milliVolts.

6. A system comprising:
    a low-voltage level converter having an input pulldown negative metal-oxide semiconductor (NMOS) transistor that provides a negative gate voltage to a positive metal-oxide semiconductor (PMOS) output driver transistor having a grounded well; and
    an output negative metal-oxide semiconductor (NMOS) field effect transistor having a gate connected to an input of the low-voltage level converter, said negative metal-oxide semiconductor (NMOS) field effect transistor gate being connected in parallel with the input pulldown negative metal-oxide semiconductor (NMOS) transistor gate, wherein:
        the drains of both the positive metal-oxide semiconductor (PMOS) field effect transistor and the output negative metal-oxide semiconductor (NMOS) field effect transistor are both connected to an output of the low-voltage level converter; and
        the sources of both the output negative metal-oxide semiconductor (NMOS) field effect transistor and the input pulldown negative metal-oxide semiconductor (NMOS) transistor are both connected to ground.

7. The system of claim 6, wherein:
    an input voltage pulse at the input of the low-voltage level converter has a higher voltage level than an output noise pulse signal at the output of the low-voltage level converter.

8. The system of claim 6, wherein:
    the low-voltage level converter operates with a multiple-level power supply having a high-voltage power supply that nominally provides between about 1.0 to 1.5 V and a low-voltage power supply that nominally provides between about 300 mV to 500 mV.

9. An on-chip test system comprising:
    a pulse generator that provides an input pulse signal at a high supply voltage level;
    a low-voltage level converter comprising:
        an input pulldown transistor that provides a negative gate voltage to an output driver positive metal-oxide semiconductor (PMOS) field effect transistor having a grounded well;
        an output negative metal-oxide semiconductor (NMOS) field effect transistor having a gate connected in parallel with the input pulldown transistor gate, and to an input of the low-voltage level converter, wherein:
            the input of the low-voltage level converter receives the input pulse signal from the pulse generator;
            the drains of both the positive metal-oxide semiconductor (PMOS) field effect transistor and the output negative metal-oxide semiconductor (NMOS) field effect transistor are both connected to an output of the low-voltage level converter;
            the sources of both the output negative metal-oxide semiconductor (NMOS) field effect transistor and the input pulldown transistor are both connected to ground; and
    a device under test connected to the output of the low-voltage level converter and that receives an output signal noise pulse at a low supply voltage level.

10. The on-chip test system of claim 9 wherein:
    the low supply voltage level is close to a threshold voltage of the output driver positive metal-oxide semiconductor (PMOS) field effect transistor and of the output negative metal-oxide semiconductor (NMOS) field effect transistor.

11. A VLSI integrated circuit chip comprising:
    a low-voltage level converter comprising:
        an output driver positive metal-oxide semiconductor (PMOS) field effect transistor with its drain connected to an output of the low-voltage level converter and having a grounded well;
        an output negative metal-oxide semiconductor (NMOS) field effect transistor with its drain connected to the output of the low-voltage level converter and having a gate connected to an input of the low-voltage level converter;
        an input pulldown negative metal-oxide semiconductor (NMOS) field effect transistor that provides a negative gate voltage at its drain to a gate of the output driver positive metal-oxide semiconductor (PMOS)

field effect transistor and having a gate connected in parallel with a gate of the output negative metal-oxide semiconductor (NMOS) field effect transistor to the input of the low-voltage level converter; and the sources of both the output negative metal-oxide semiconductor (NMOS) field effect transistor and the input pulldown transistor are connected to ground, wherein:

the input of the low-voltage level converter receives an input pulse signal at a high supply voltage level; and the low-voltage level converter provides an output signal noise pulse at a low supply voltage level.

12. The VLSI integrated circuit chip of claim 11, further comprising:
a pulse generator that provides the input pulse signal at the high supply voltage level.

13. The VLSI integrated circuit chip of claim 11, further comprising:
a device under test connected to the output of the low-voltage level converter and that receives the output signal noise pulse at the low supply voltage level.

14. The VLSI integrated circuit chip of claim 11, wherein:
a rise time of the output pulse is less than 350 picoseconds in response to a square wave input pulse.

15. The VLSI integrated circuit chip of claim 11, wherein:
a coupling effect between the input pulse signal and the output signal noise pulse due to Miller effect is no greater than about 30 mV.

16. The VLSI integrated circuit chip of claim 11, wherein:
the low supply voltage level is no greater than approximately 500 mV.

17. The VLSI integrated circuit chip of claim 11, wherein:
a voltage of the input pulse is nominally about 1.2 V.

18. A method of voltage level conversion, comprising the steps of:
connecting a drain of an input pulldown transistor to a gate of a first output driver transistor to provide a negative gate voltage to the output driver transistor;
connecting a source of the input pulldown transistor and a source of a second output transistor and a well of the first output driver transistor to ground;
connecting a drain of the first output driver transistor to an output of a low-voltage level converter;
connecting a drain of the second output transistor to the output of the low-voltage level converter;
connecting a source of the first output driver transistor to a low supply voltage level so that the output signal noise pulse is provided at the low supply voltage level; and
applying an input pulse in parallel to a gate of the input pulldown transistor and a gate of the second output transistor; wherein
applying the input pulse to the gate of the input pulldown transistor provides an output signal noise pulse at the output of the low-voltage level converter at a lower voltage than that of the input pulse.

19. The method of claim 18, wherein the applying step further comprises:
applying the input pulse from a pulse generator at a high supply voltage level.

20. The method of claim 18, wherein the first output driver transistor is a positive metal-oxide semiconductor (PMOS) field effect transistor.

21. The method of claim 18, further comprising the step of:
driving a load with the output signal noise pulse, wherein the load is a device under test.

22. The method of claim 18, wherein:
the step of connecting the output transistor includes connecting a negative metal-oxide semiconductor (NMOS) field effect transistor.

23. The method of claim 18, wherein:
the step of connecting the input pulldown transistor includes connecting a negative metal-oxide semiconductor (NMOS) field effect transistor.

24. A low-voltage level, comprising:
a first means for driving a load comprising a first transistor, the first transistor having a first gate, a first source connected to a lower supply voltage of a dual-level voltage supply, a first well connected to ground, and a first drain;
a second means for driving a load, said second means comprising a second transistor, the second transistor having a second gate connected to an input, a second source connected to ground, and a second drain coupled to the first drain; and
means for providing a pulldown gate voltage to the first means for driving a load comprising a third transistor, the third transistor having a third gate connected to the input, a third drain connected to the first gate, and a third source connected to ground, wherein:
the first, second, and third transistors are configured such that the pulldown gate voltage increases the current drive, and
decreases switching time, of the first means for driving a load.

25. The low-voltage level converter of claim 24, further including:
means for lowering a threshold voltage of the first means for driving a load.

26. The low-voltage level converter of claim 24, further comprising:
means for providing current to the first means for driving a load from the lower supply voltage of the dual-level voltage supply.

27. The low-voltage level converter of claim 26, wherein:
the means for providing a pulldown gate voltage receives an input pulse having a higher voltage than the lower supply voltage.

* * * * *